(12) United States Patent
Chamla et al.

(10) Patent No.: US 7,436,260 B2
(45) Date of Patent: Oct. 14, 2008

(54) CONTROLLING THE RATIO OF AMPLIFICATION FACTORS BETWEEN LINEAR AMPLIFIERS

(75) Inventors: David Chamla, Grenoble (FR); Andreia Cathelin, Laval (FR); Andreas Kaiser, Villeneuve d' Ascq (FR)

(73) Assignee: STMicroelectronics SA, Montrouge (FR)

( * ) Notice: Subject to any disclaimer, the term of this patent is extended or adjusted under 35 U.S.C. 154(b) by 96 days.

(21) Appl. No.: 11/648,104

(22) Filed: Dec. 29, 2006

(65) Prior Publication Data

US 2007/0188237 A1    Aug. 16, 2007

(30) Foreign Application Priority Data

Dec. 30, 2005    (FR)    ................... 05 13489

(51) Int. Cl.
    *H03F 3/68*    (2006.01)
(52) U.S. Cl. ............... 330/124 R; 330/254; 330/53
(58) Field of Classification Search ............ 330/124 R, 330/254, 53
    See application file for complete search history.

(56) References Cited

U.S. PATENT DOCUMENTS

| 4,794,343 | A | * | 12/1988 | Yang ............... 330/2 |
|---|---|---|---|---|
| 4,885,517 | A | * | 12/1989 | Pennock ............ 318/678 |
| 5,663,682 | A |   | 9/1997  | Meline et al. |
| 5,783,969 | A | * | 7/1998  | Luz ............... 330/124 R |
| 6,639,463 | B1 | * | 10/2003 | Ghanadan et al. ....... 330/124 R |
| 6,737,922 | B2 | * | 5/2004  | Pengelly et al. ......... 330/295 |
| 6,894,564 | B1 | * | 5/2005  | Gilbert ............ 330/254 |
| 2001/0048342 | A1 |   | 12/2001 | Yoshida et al. |
| 2005/0242871 | A1 |   | 11/2005 | Wang |

OTHER PUBLICATIONS

Yannis P. Tsividis, "Integrated Continuous-Time Filter Design—An Overview," IEEE Journal of Solid-State Circuits, vol. 29, No. 3, Mar. 1994, pp. 166-176.

* cited by examiner

*Primary Examiner*—Patricia Nguyen

(57) ABSTRACT

An electronic device where the ratio between two amplification factors of two amplifiers, called main amplifiers, is adjusted using a control means. The control means constantly equalizes the output signals of the two main amplifiers by adapting one of the control signals. The output signals are acted on in order to adjust the control signals. Owing to the fact that the input signals are in a ratio N, this same ratio is obtained between the amplification factors of the two main amplifiers. The two main control signals, used to control the main amplifiers, are employed for controlling any other amplification factor of at least two other amplifiers or groups of amplifiers, so as to establish a ratio N between these other amplification factors. The main circuit thus allows N to be applied and regulated between the amplification factors of other amplifiers.

20 Claims, 6 Drawing Sheets

CONTROLLING THE RATIO OF AMPLIFICATION FACTORS BETWEEN LINEAR AMPLIFIERS

CROSS-REFERENCE TO RELATED APPLICATIONS

The present application is related to French Patent Application No. 0513489, filed Dec. 30, 2005, entitled "METHOD FOR CONTROLLING THE RATIO OF THE AMPLIFICATION FACTORS OF TWO LINEAR AMPLIFIERS, AND DEVICE FOR SAME". French Patent Application No. 0513489 is assigned to the assignee of the present application and is hereby incorporated by reference into the present disclosure as if fully set forth herein. The present application hereby claims priority under 35 U.S.C. §119(a) to French Patent Application No. 0513489.

TECHNICAL FIELD

The present disclosure relates to amplifiers and, notably, to the control of the ratio between the amplification factors of at least two amplifiers with controllable amplification factors such as, for example, linear amplifiers.

BACKGROUND

Conventionally, a receiver unit includes various filters whose cut-off frequency must be very precisely fixed. However, by reason of temperature variations or of the variations, for example, in the power supply voltage, the parameters of the filters used exhibit very wide variations typically between 40% and 50%.

In order to limit these variations, the filter cut-off frequency is controlled by a control signal delivered by another system called a master system. This conventional filter structure is described, for example, in the article 'Integrated Continuous-Time Filter Design—An Overview', Yannis Tsividis, IEEE Journal of Solid-State Circuits, vol. 29, no. 3, Mar. 1997, pp. 166-176. The master system may include for example, a phase-locked loop operating according to a stable reference frequency delivered by an external component such as, for example, a quartz oscillator. The master system includes linear amplifiers that are identical to (or possibly homothetic with) those incorporated into the filter, and with an amplification factor that is internally controlled by the same signal used for controlling the cut-off frequency of the filter.

This control of the master/slave type (the slave being the filter) typically allows a precision of around 5%. Furthermore, in order to make the filter operate over various frequency ranges, a divider or a multiplier by N may be used between the control signal output from the master system and the control signal of the filter, if the relationship between the amplification factor of the amplifiers incorporated in the filter and its control quantity is perfectly proportional. Thus, the ratio N may be introduced between the amplification factor of the master system amplifiers and the amplification factor of the amplifiers of the filter.

Owing to the relationship between the amplification factor and the frequency (detailed herein below), the cut-off frequency of the latter is varied as a function of the oscillation frequency of the master system, in the same ratio N. Accordingly, if V denotes the control signal output from the master system, k is the amplification factor of the ideal amplifiers used in the filter and the master system, and by the relationship k=A*V, where A is the coefficient linking the control signal, then Equation 1 below results.

$$f_{osc} = \frac{A \cdot V \cdot k}{2\pi C} \text{ and } fc = \frac{A \cdot V \cdot k}{N \cdot 2\pi C}$$ (Eqn. 1)

In Equation 1, $f_{osc}$ is the master system oscillation frequency, $f_c$ the filter cut-off frequency and C a reference capacitance value for the device in question (master system or filter to be controlled). Using these relationships, Equation 2 results.

$$f_c = f_{osc}/N$$ (Eqn. 2)

In other words, by controlling and adjusting the amplification factor k of the amplifiers incorporated into the filter by means of a control signal such as that described hereinabove, a ratio of N is established between the amplification factors of the master system and of the filter, and hence the oscillation frequency of the master system and the cut-off frequency of the filter.

However, the relationship of proportionality between the value of the control signal of the amplifier and its actual amplification factor is never perfect. For example, non-linearities in the control of the amplifier always exist and thus lead to the impossibility of using directly the principle stated hereinabove between the theoretical relationship of proportionality and that observed between the oscillation frequency of the master system and the cut-off frequency of the filter, in this example.

There is therefore a need for a device that is capable of establishing a ration N between two amplification factors, and more particularly, a device capable of establishing two frequencies which are independent of the non-linearity phenomena in the control of the amplifiers.

SUMMARY

The present disclosure provides a device capable of establishing a ratio N between at least two amplification factors, and consequently two frequencies, which is independent of the non-linearity phenomena in the control of the amplifiers. The present disclosure also provides a device that allows a filter cut-off frequency to be controlled by means of a stable external signal, in particular when a division or multiplication ratio is introduced between the filter cut-off frequency and the external frequency.

In one embodiment, the present disclosure provides an electronic device having a main circuit. The main circuit includes at least two main linear amplifiers each having a respective amplification factor and each respectively controllable by two main control signals. Each of the main linear amplifiers can respectively receive two input signals and deliver two output signals, the levels of the two input signals being in a ratio N. The main circuit also includes a controller to adjust the value of at least one of the two main control signals in such a manner as to equalize the output signals, the two amplification factors then being in the same ratio N.

In another embodiment, the present disclosure provides a method of controlling the ratio of amplification factors of controllable linear amplifiers. The method includes adjusting N to a desired value. N is the ratio between the respective amplification factors of two main linear amplifiers that are controllable by two main control signals. The adjustment is accomplished by receiving two input signals and the delivery of two output signals by the main amplifiers, where the levels of the two input signals being in a ratio of N. The adjustment also includes controlling one of the two main control signals so as to equalize the output signals, where now the two amplification factors are in the same ratio N.

In still another embodiment, the present disclosure provides a main circuit with a differential architecture. Thus, the input and output signals are of differential quantities. The main circuit includes at least two main linear amplifiers each having a respective amplification factor and each respectively controllable by two main control signals. Each of the main linear amplifiers can respectively receive two input signals and deliver two output signals, the levels of the two input signals being in a ratio N. The main circuit also includes a controller to adjust the value of at least one of the two main control signals in such a manner as to equalize the output signals, the two amplification factors then being in the same ratio N. The controller includes a feedback circuit to control the value of one of the control signals to the difference between the two output signals.

Other technical features may be readily apparent to one skilled in the art from the following figures, descriptions and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

The present disclosure provides an electronic device where the ratio between two amplification factors of two amplifiers, called main amplifiers, is adjusted using a control means. The control means constantly equalizes the output signals of the two main amplifiers by adapting one of the control signals. In contrast to conventional solutions, the output signals are acted on in order to adjust the control signals. Owing to the fact that the input signals are in a ratio N, this same ratio is obtained between the amplification factors of the two main amplifiers. The two main control signals, used to control the main amplifiers, may be employed for controlling any other amplification factor of at least two other amplifiers or groups of amplifiers, respectively of the same type and same structure as the main amplifiers, so as to establish a ratio N between these other amplification factors. In such an application, the main circuit forms a regulation core of the ratio N, which allows a ratio N to be applied and regulated between the amplification factors of other amplifiers.

Accordingly, in contrast to conventional solutions that use two control signals linked by a proportionality factor, embodiments of the present disclosure decouples these two control signals and adjusts the ratio between two amplification factors by means of another circuit (the regulation core) that regulates this ratio using a control means acting on two other quantities, in the present case the output signals of the main amplifiers.

Figure 1:
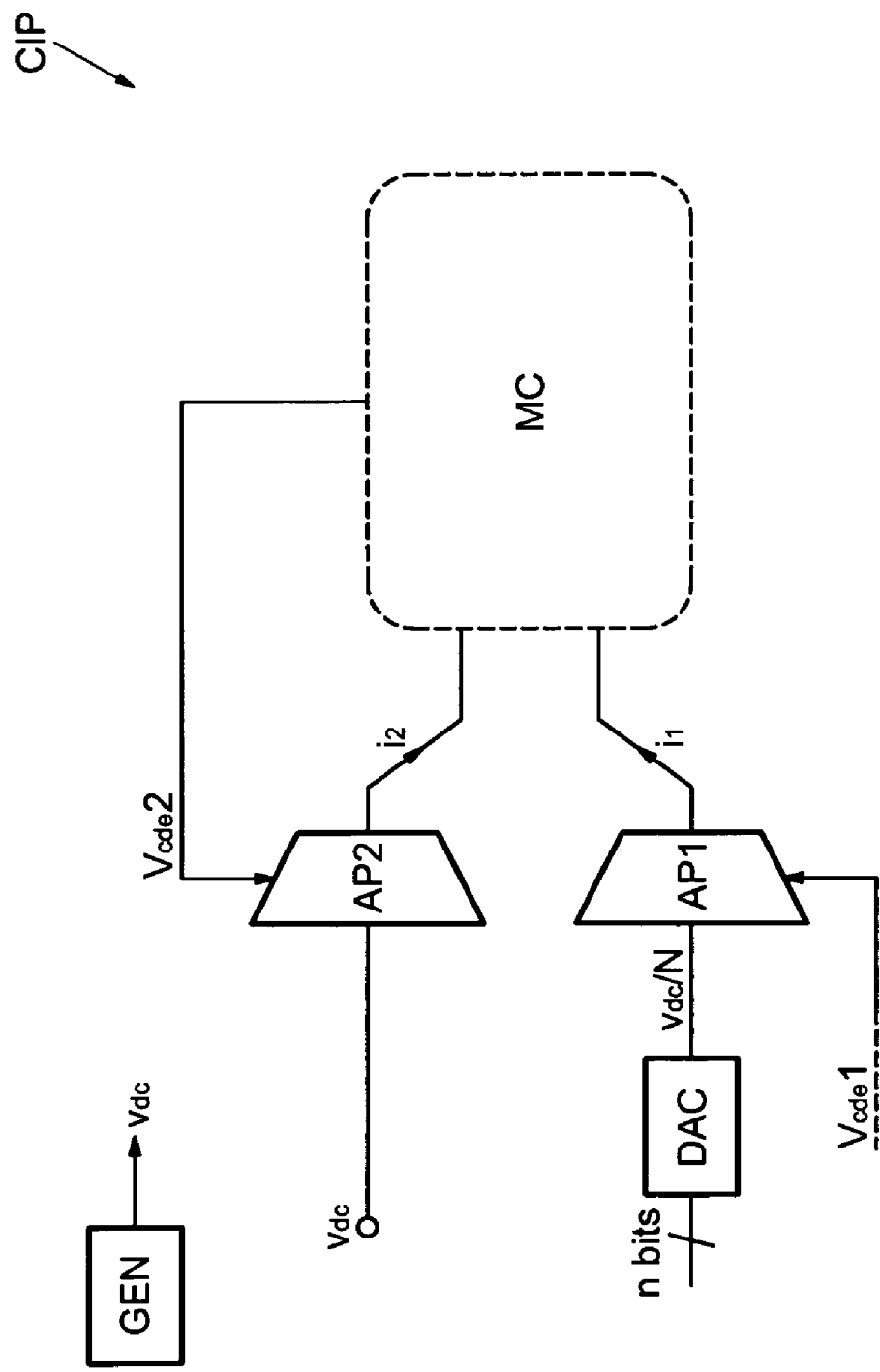
FIG. 1 describes schematically an embodiment of a main circuit according to the present disclosure.

In FIG. 1, the main circuit CIP 100 includes a first main linear amplifier AP1 102 controlled by a main control signal Vcde1 104, here a control voltage. The control signal Vcde1 104 is, in principle, arbitrary, but must belong to the domain of operation of the main amplifier AP1 102. The main circuit CIP 100 also comprises a second main linear amplifier AP2 106 controlled by a second main control signal Vcde2 108, here a voltage.

The second main amplifier AP2 106 receives a reference signal, here a voltage vdc delivered by a generator GEN 110, at its input. This voltage vdc has an arbitrary value belonging to the domain of operation of the main amplifiers AP1 102 and AP2 106 and is of the form referred to as 'small signal', in other words that it is formed by a static value and can have a small dynamic variation around this static value. The voltage vdc is delivered to a divider DAC 112 that is programmable using n bits. The divider DAC 112 then delivers an output voltage equal to vdc/N, N being the division ratio of the divider DAC 112.

The division ratio N is a real number. As a variant, a multiplier by N could be used. The first main amplifier AP1 102 receives the divided voltage vdc/N at its input and delivers a current i1 at its output. With regard to the second main amplifier AP2 106, this delivers a current i2. In the case of main amplifiers AP1 102 and AP2 106, of the transconductance type (which is the case for all the amplifiers hereinafter cited as examples), having respective transconductances gm1 and gm2, the following relationships, Equations 3 and 4, hold true.

$$i2 = gm2 \cdot vdc \quad \text{(Eqn. 3)}$$

$$i1 = gm1 \cdot vdc/N \quad \text{(Eqn. 4)}$$

Consequently, equalizing the currents i1 and i2 leads to Equation 5.

$$gm2 = gm1/N \quad \text{(Eqn. 5)}$$

Thus, in order to obtain the ratio N between the two transconductances of the two main amplifiers AP1 102 and AP2 106, it suffices to equalize the two current i1 and i2. For this purpose, the two currents i1 and i2 are delivered to control means MC 114. The control means MC 114 deliver at the output the control voltage Vcde2, which is a function of the difference existing between the output currents i1 and i2, in such a manner as to modify gm2, and hence i2, so that it is equal to i1. In this way, the two main amplifiers AP1 102 and AP2 106 now have two transconductances in the ratio N.

Figure 2:
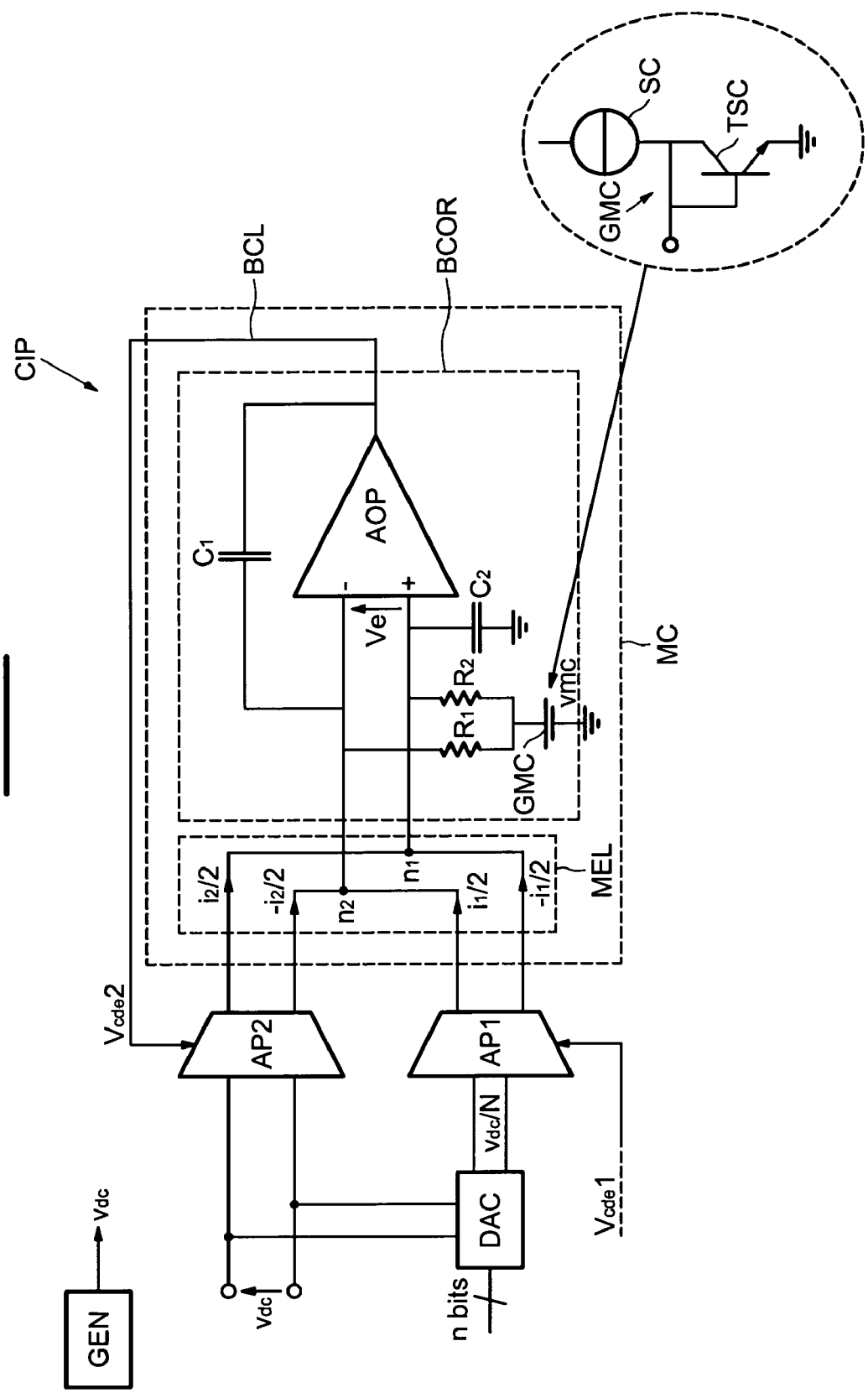
FIG. 2 describes in more detail an embodiment of a main circuit according to the present disclosure.

Reference is now made to FIG. 2 that details one embodiment of the control means MC 114 of the main circuit CIP 100. For this embodiment, the circuit CIP 100 is considered to have a differential architecture. The correction means MC 114 here form feedback control means for the control signal Vcde2. They comprise generation means MEL 202 which correspond, in this example, to addition means. They comprise a first node n1 between the second output of the main amplifier AP2 106 and the first output of the main amplifier AP1 102, in such a manner as to generate a signal, here a current, equal to Equation 6.

$$\frac{(i1-i2)}{2} \qquad \text{(Eqn. 6)}$$

The generation means MEL 202 also comprise a second node n2 connecting the first output of the main amplifier AP2 106 to the second output of the main amplifier AP1 102 so as to generate a current equal to Equation 7.

$$\frac{(i2-i1)}{2} \qquad \text{(Eqn. 7)}$$

In the case of a negative ratio N, those skilled in the art should know how to adapt the generation means MEL 202 by replacing the addition means with subtraction means. Similarly, those skilled in the art will know how to adapt the generation means MEL 202 in the case where the output signal quantities from the main amplifiers AP1 102 and AP2 106 are voltages.

The two currents generated by the generation means MEL 202 are delivered to a correction unit BCOR 204 capable of applying, in this example, a correction of the proportional-integral type. An operational amplifier AOP 206 receives the two currents generated by the generation means MEL 202 at its inputs.

The correction unit BCOR 204 also comprises two resistors R1 and R2, here of the same value R, respectively connected between each input of the operational amplifier AOP 206 and a common-mode voltage generator GMC 208 delivering a voltage vmc and connected to ground. The differential voltage across the terminals of the AOP 206 is therefore equal to R(i2−i1).

The generator GMC 208 can be formed, for example, by means of a current source SC 210 connected to a transistor TSC 212 whose control electrode is fed back onto the electrode connected to the source SC 210, the last electrode being connected to ground. The correction integral is performed by means of two capacitors C1 and C2, here of the same value, respectively connected between the inverting input and the output of the operational amplifier AOP 206 and between the non-inverting input and the ground of the operational amplifier AOP 206. This correction allows the signal delivered at the output to be stabilized.

Finally, the correction means MC 114 comprise a feedback control loop BCL 214 connecting the output of the operational amplifier AOP 206 to the control input of the second main amplifier AP2 106. It should be understood that the respective roles of amplifiers AP1 102 and AP2 106 may be interchanged. By way of example, the voltage vmc can be equal to around 0.8 V, the resistors R1 and R2 can be around 20 kΩ, the capacitors C1 and C2 around 10 pF, and the gain of the operational amplifier AOP 206 is preferably very high, for example equal to around 50 dB.

Figure 3:
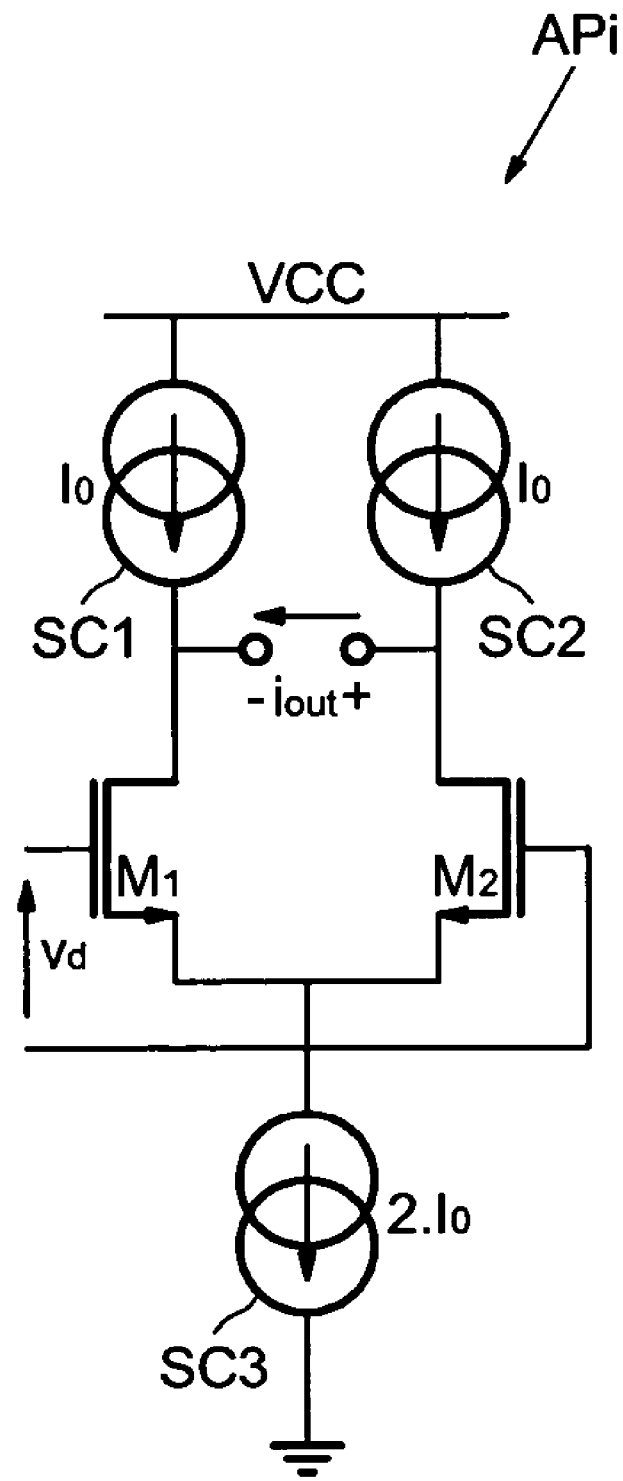
FIG. 3 describes more particularly an example of a part of a linear amplifier incorporated in a device, according to the present disclosure.

The transconductances of the main linear amplifiers AP1 102 and AP2 106 can vary between 10 and 250 µA/V. More generally, the correction unit BCOR 204 can perform a correction of the proportional-integral-derivative type. An example of amplifier with controllable transconductance, used to form the main amplifiers AP1 102 and AP2 106, is shown in FIG. 3. The amplifier Ap1 300 receives a differential voltage vd at its input. This is applied between the two control electrodes of two transistors M1 302a and M2 302b, here of the NMOS type. Each transistor M1 302a and M2 302b is biased by a current I0 respectively delivered by a controlled current source SC1 304a and another controlled current source SC2 304b. The two current sources SC1 304a and SC2 304b are connected to a power supply terminal delivering a voltage VCC 306.

The current sources SC1 304a and SC2 304b are conventionally formed by means of transistors configured as current sources. The two input electrodes (here the sources) of the transistors M1 302a and M2 302b are common, and the common node is connected to a third controllable current source SC3 308 delivering a current equal to 2*I0. The current source SC3 308 is furthermore connected via its other terminal to ground. The output current iout is delivered by the main amplifier APi 300 and measured between two output electrodes (here the drains) of the transistors M1 302a and M2 302b. This output current iout corresponds to the difference between the current coming from the drains of M1 302a and of M2 302b and their biasing currents output from the sources SC1 304a and SC2 304b, respectively.

For the case where the amplifiers have opposite values of transconductance, the differential input terminals or the differential output terminals are reversed. The main circuit CIP 100 such as was previously described hereinabove allows, notably, two control signals to be obtained (here Vcde1 and Vcde2) in order to be able to control two auxiliary linear amplifiers of the same type and same structure as the main amplifiers.

In the case of auxiliary amplifiers with controllable transconductances, the control signals (main ones in the case of the circuit CIP) are applied to the control terminals of the sources SC1 304a and SC2 304b, and more precisely to the control electrodes of the transistors forming these sources. Those skilled in the art will know how to adapt the application of the control signals in the case of transimpedance amplifiers or amplifiers with voltage/voltage or current/current gains.

By 'the same structure of two linear amplifiers' is understood the fact that they are identical or homothetic, in other words that there exists a ratio α between the dimensions of the components of each of the amplifiers (for example, the dimensions W and L of the transistors) and also between the biasing sources of these amplifiers. Consequently, by means of the two main control signals, it is possible to control two groups of auxiliary linear amplifiers, each group being of the same type and same structure as one of the main linear amplifiers of the circuit CIP 100, such as is defined hereinabove.

Given that these two groups of auxiliary linear amplifiers are of the same type, have the same structure as the main linear amplifiers and that their control signals are the same, the same ratios can then be established between the amplification factors of the auxiliary amplifiers of each group as that existing between the main linear amplifiers. Examples of devices using the main control signals Vcd1 and Vcd2 are described hereinafter.

Figure 4:
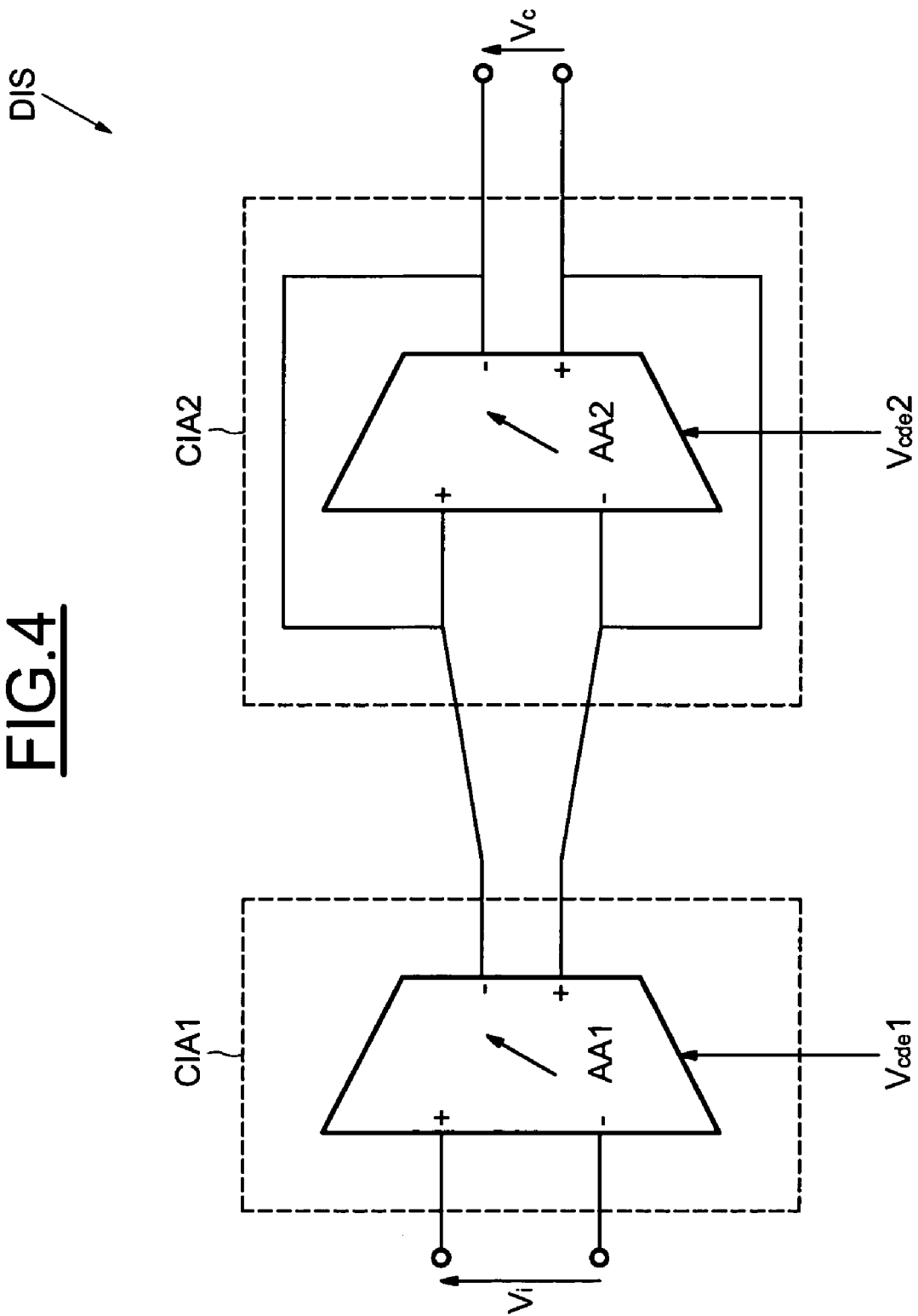
FIG. 4 illustrates an electronic device incorporating two embodiments of auxiliary circuits according to the present disclosure.

In FIG. 4, a device DIS 400 representing a variable-gain amplifier (or VGA) is illustrated, here with differential architecture, formed using two auxiliary circuits CIA1 402a and CIA2 402b. The first auxiliary circuit CIA1 402a comprises an amplifier AA1 (or transconductor) 404 having a controllable transconductance GM1. The transconductor AA1 404 receives an input voltage Vi at its differential input, and is controlled by an auxiliary control signal which corresponds to the main control voltage Vcde1. The amplifier AA1 404 is chosen so as to have the same structure as the main amplifier AP1 102 or 300, such as is defined hereinabove.

The second auxiliary circuit CIA2 402b comprises a second auxiliary amplifier AA2 406 whose non-inverting input is connected to the inverting output of the auxiliary amplifier AA1 404, and the inverting input is connected to the non-inverting output of the auxiliary amplifier AA1 404. Furthermore, the inverting output of the amplifier AA2 406 is fed back onto its non-inverting input and its non-inverting output is connected to its inverting input.

The auxiliary amplifier AA2 406 delivers a voltage Vo at its output. In addition, the auxiliary control signal of the auxiliary amplifier AA2 406 corresponds to the control voltage Vcde2, the structure and the type of the auxiliary amplifier AA2 corresponding to those of the main amplifier AP2 106. The amplifier AA2 406 has a transconductance GM2 and, in this device, plays the role of a resistance whose resistivity is equal to 1/GM2, in such a manner that the voltage gain of the controlled-gain amplifier is equal to GM1/GM2.

Owing to the fact that the auxiliary amplifiers AA1 404 and AA2 406 have the same structure as the main amplifiers AP1 102 or 300 and AP2 10 of the main circuit, and that they are respectively controlled by the control signals Vcde1 and Vcde2, then Equation 8 holds. Consequently, the controlled gain GM1/GM2 is equal to N.

$$GM1 = N*GM2 \qquad \text{(Eqn. 8)}$$

Figure 5:
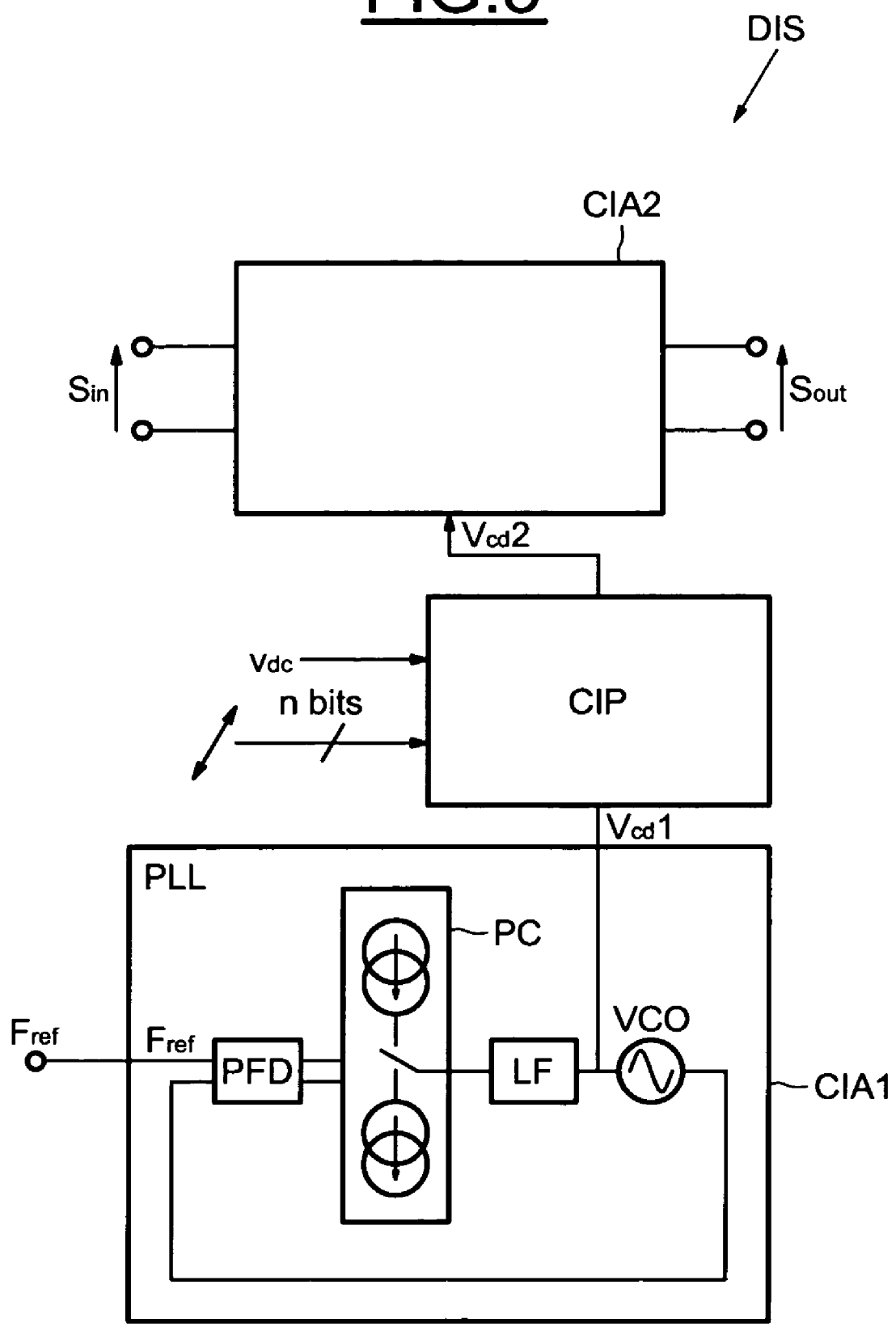
FIG. 5 illustrates another embodiment of a device incorporating two embodiments of auxiliary circuits according to the present disclosure.

Reference is now made to FIG. 5 which illustrates one embodiment of the device 500 according to the present disclosure where the two auxiliary circuits CIA1 402a and CIA2 402b respectively form master means and slave means. The slave means CIA2 402b here correspond to a controlled filter whose control allows the cut-off frequency to be stabilized to a value proportional to a reference frequency output from the master means CIA1 402a. The slave means CIA2 402b receives an input signal Sin at the input and deliver an output signal Sout at the output.

The auxiliary circuit CIA2 402b is connected to a main circuit CIP 100 from which it receives the main control voltage Vcde2 108, as auxiliary control signal. The circuit CIA2 here comprises filtering means, for example a low-pass filter.

Figure 6:
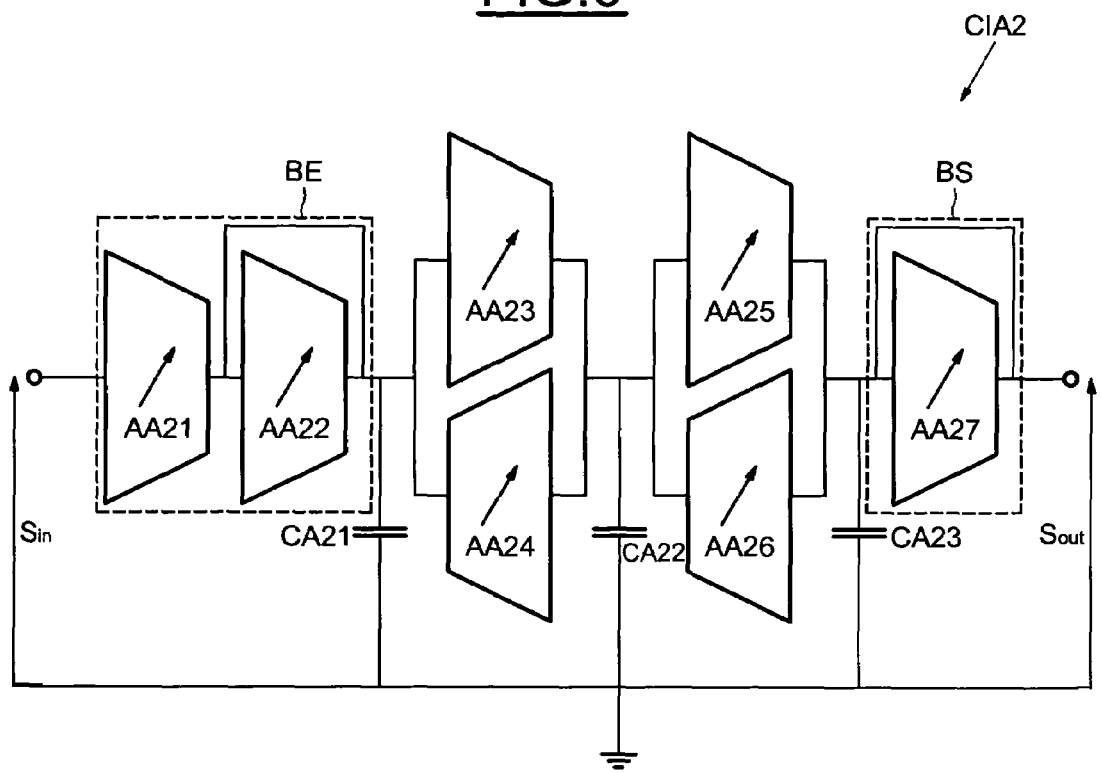
FIG. 6 illustrates an embodiment of a part of an auxiliary circuit according to the present disclosure.

An example of filter 600 that can be incorporated into the auxiliary circuit CIA2 402b is illustrated in FIG. 6. This filter can comprise an input unit BE 602 formed from a first auxiliary linear amplifier with controllable transconductance AA21 604 connected in series with a second auxiliary controllable linear amplifier AA22 606, whose output is fed back onto its input. It also comprises an output unit BS 608 comprising an auxiliary linear amplifier with controllable transconductance AA27 610, whose output is fed back onto its input.

Between the input unit BE 602 and the output unit BS 608, two units of the gyrator type, in other words formed from two auxiliary linear amplifiers with controllable transconductance connected as a flip-flop and having opposite transconductance values, are connected in series. The first structure comprises the auxiliary amplifiers AA23 612 and AA24 614 and the second structure comprises the auxiliary amplifiers AA25 616 and AA26 618.

A first capacitor CA21 is connected between the node common to the input unit BE 602 and to the amplifier AA23 612, and ground. Similarly, a second and a third capacitor CA22 and CA23 are respectively connected between the node common to the auxiliary amplifiers AA23 612 and AA25 616 and ground, and between the node common to the auxiliary amplifier AA25 616 and the output unit BS 608 and ground. All of the auxiliary amplifiers with controllable transconductance of the auxiliary circuit CIA2 402b are controlled by one and the same auxiliary control signal corresponding to the main control signal Vcde2 108. For this purpose, they have the same structure and are of the same type as the main amplifier AP2 106 of the main circuit CIP 100.

Reference is again made to FIG. 5. The auxiliary circuit CIA1 402a here forms the master means, whose oscillation frequency is used to feedback control the cut-off frequency of the filter of the auxiliary circuit CIA2 402b. The auxiliary circuit CIAL 402a is formed here from a phase-locked loop PLL 502 constructed in the conventional manner. The latter receives a reference frequency Fref, supplied for example by a quartz oscillator, at its input.

The reference frequency Fref is delivered to a phase/frequency discriminator PFD 504 connected to a charge pump PC 506 delivering a voltage to a voltage-controlled oscillator VCO 508, via a filter LF 510. The output signal from the oscillator VCO 508 is delivered to the input of the phase/frequency discriminator via a feedback loop. In addition, the control voltage of the voltage-controlled oscillator VCO 508 is delivered to the main circuit CIP 100, as main control signal Vcd1, so as to control the first main amplifier AP1 102 or 300.

Figure 7:
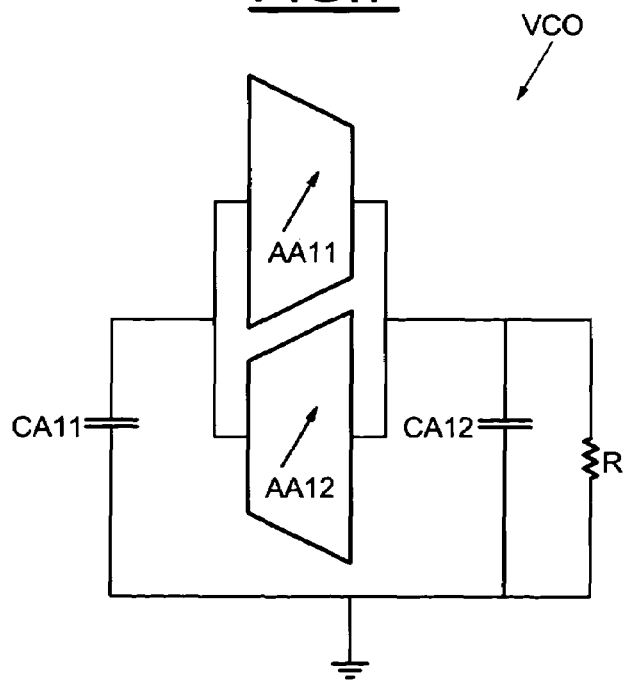
FIG. 7 illustrates an auxiliary circuit according to the embodiment of the device presented in FIG. 5.

The oscillator with voltage control 700 is then formed using controllable-transconductance amplifiers, as shown for example in FIG. 7. In this example, the voltage-controlled oscillator VCO 508 comprises a structure of the gyrator type formed from two auxiliary amplifiers with controllable transconductance AA11 702 and AA12 704 connected in series between two capacitors CA11 and CA12. In addition, a resistance R of negative resistivity is connected in parallel with the capacitor CA12.

The two auxiliary amplifiers AA11 702 and AA12 704 are controlled by an auxiliary control signal which is the voltage delivered to the voltage-controlled oscillator VCO 508, and which also corresponds to the main control signal Vcd1. The auxiliary amplifiers used to form the voltage-controlled oscillator VCO 508 are of the same type and same structure as the main amplifier AP1 102 or 300.

Reference is again made to FIG. 5. The main circuit CIP 100 allows the cut-off frequency of the filter of the auxiliary circuit CIA2 402b to be stabilized and also this cut-off frequency to be varied in such a manner that the filter of the auxiliary circuit CIA2 402b is able to operate within various frequency bands. Because of the use of the main circuit CIP 100, the control signal Vcde2 108 for the cut-off frequency of the circuit CIA2 402b is no longer proportional to the control voltage Vcd1 of the voltage-controlled oscillator VCO 508, and is therefore no longer sensitive to the linearity problems caused by the approximation of the proportionality ratio associated with the use of a divider (or multiplier).

The range of the dispersion in the filter characteristics can then be reduced to a percentage of around 2%. Although the examples described hereinabove implement transconductance linear amplifiers, it is equally possible to use transimpedance linear amplifiers or those with voltage/voltage or current/current gains, all these amplifiers having an amplification ratio controllable by a voltage or a current depending on the embodiment used.

The present disclosure is advantageously, but not exclusively, used in telecommunications systems, notably within receiver units and, in particular, for the control of cut-off frequencies of filters incorporating controllable linear amplifiers used within receiver units.

The term 'amplification factor' here encompasses notably voltage/voltage and current/current gains, transimpedances and transconductances. Consequently, the embodiments of the present disclosure may be applied to any type of linear amplifier implementing one of the aforementioned amplification factors and the associated electrical quantities.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An electronic device having a main circuit, the main circuit comprising:
at least two main linear amplifiers each having a respective amplification factor and each respectively controllable by two main control signals,
wherein each of the main linear amplifiers can respectively receive two input signals and deliver two output signals, the levels of the two input signals being in a ratio N; and
a controller to adjust the value of at least one of the two main control signals in such a manner as to equalize the output signals, the two amplification factors then being in the same ratio N.

2. The main circuit according to claim 1 further comprising:
a generator to generate a reference signal; and
a divider coupled to the output of the generator and configured to deliver the said reference signal divided by N, the input signal of one of the amplifiers being the reference signal and the input signal of the other amplifier being the reference signal divided by N.

3. The main circuit according to claim 1 further comprising:
a generator to generate a reference signal; and
a multiplier coupled to the output of the generator and configured to deliver the said reference signal multiplied by N, the input signal of one of the amplifiers being the reference signal and the input signal of the other amplifier being the reference signal multiplied by N.

4. The main circuit according to claim 1, wherein the controller comprises a feedback circuit to control the value of one of the control signals to the difference between the two output signals.

5. The main circuit according to claim 1, wherein the feedback circuit further comprises:
a generator to generate an intermediate signal representative of the difference between the two output signals; and
a correction unit coupled to the generator and configured to effect a correction of the proportional-integral type on the intermediate signal.

6. The main circuit according to claim 5, wherein the correction unit also effects a correction of the derivative type.

7. The main circuit according to claim 1, wherein the main circuit comprises a differential architecture, the input and output signals being differential quantities.

8. The main circuit according to claim 7, wherein the output signals delivered by the main amplifiers are currents and wherein the generator further comprises:
an adder to add, on the one hand, the value of the current delivered on the first differential channel of a first main amplifier and the value of the current delivered on the second differential channel of the other main amplifier and, on the other hand, the value of the current delivered on the second differential channel of the first main amplifier and the value of the current delivered on the first differential channel of the other main amplifier.

9. The main circuit according to claim 8, wherein the correction unit further comprises:
an operational amplifier;
two resistors connected between each of the inputs of the operational amplifier and a common-mode voltage generator;
a first capacitor connected between the non-inverting input of the operational amplifier and ground; and
a second capacitor, of the same value as the said first capacitor, connected between the output and the inverting input of the operational amplifier.

10. The main circuit according to claim 1 further comprising:
at least two auxiliary circuits each comprising at least one auxiliary linear amplifier with an amplification factor controllable by an auxiliary control signal, the auxiliary amplifiers of the two auxiliary circuits respectively having the same structures as those of the two main amplifiers,
wherein the auxiliary control signals respectively associated with the two auxiliary circuits are respectively produced from the main control signals respectively associated with the main amplifiers of corresponding structures.

11. The main circuit according to claim 10, wherein the first and the second auxiliary circuits respectively comprise a first and a second auxiliary linear amplifier connected in series, the output of the second auxiliary linear amplifier being fed back onto its input.

12. The main circuit according to claim 10, wherein the first auxiliary circuit forms a slave means, which comprises a filter incorporating at least one auxiliary linear amplifier, and
wherein the second auxiliary circuit forms a master means, to control feedback controlling the cut-off frequency of the filter, and which comprises a phase-locked loop comprising a voltage-controlled oscillator constructed using at least two linear amplifiers controlled by the auxiliary control signal associated with the said second auxiliary circuit, and
wherein the auxiliary control signal associated with the said second auxiliary circuit being delivered to the main circuit so as to form the control signal for the main amplifier receiving the reference signal divided or multiplied by N.

13. A method of controlling the ratio of amplification factors of controllable linear amplifiers, the method comprising:
adjusting N to a desired value, wherein N is the ratio between the respective amplification factors of two main linear amplifiers that are controllable by two main control signals, wherein the adjustment further comprises:
receiving two input signals and the delivery of two output signals by the main amplifiers, the levels of the two input signals being in a ratio of N; and
controlling one of the two main control signals so as to equalize the output signals, the two amplification factors then being in the same ratio N.

14. The method according to claim 13, wherein the controlling step is accomplished with controllable amplification factors from an auxiliary control signal, wherein the controllable linear amplifiers respectively have the same structures as that of the main amplifiers, and wherein the auxiliary control signals are generated from the main control signals respectively associated with the main amplifiers of corresponding structures.

15. A main circuit with a differential architecture, the input and output signals being differential quantities, the main circuit comprising:

at least two main linear amplifiers each having a respective amplification factor and each respectively controllable by two main control signals, wherein each of the main linear amplifiers can respectively receive two input signals and deliver two output signals, the levels of the two input signals being in a ratio N; and a controller to adjust the value of at least one of the two main control signals in such a manner as to equalize the output signals, the two amplification factors then being in the same ratio N, wherein the controller comprises a feedback circuit to control the value of one of the control signals to the difference between the two output signals.

16. The main circuit according to claim 15 further comprising:

a generator to generate a reference signal; and a divider coupled to the output of the generator and configured to deliver the said reference signal divided by N, the input signal of one of the amplifiers being the reference signal and the input signal of the other amplifier being the reference signal divided by N.

17. The main circuit according to claim 15 further comprising:

a generator to generate a reference signal; and a multiplier coupled to the output of the generator and configured to deliver the said reference signal multiplied by N, the input signal of one of the amplifiers being the reference signal and the input signal of the other amplifier being the reference signal multiplied by N.

18. The main circuit according to claim 15, wherein the feedback circuit further comprises:

a generator to generate an intermediate signal representative of the difference between the two output signals; and a correction unit coupled to the generator and configured to effect a correction of the proportional-integral type on the intermediate signal.

19. The main circuit according to claim 18, wherein the correction unit also effects a correction of the derivative type.

20. The main circuit according to claim 15 further comprising:

at least two auxiliary circuits each comprising at least one auxiliary linear amplifier with an amplification factor controllable by an auxiliary control signal, the auxiliary amplifiers of the two auxiliary circuits respectively having the same structures as those of the two main amplifiers, wherein the auxiliary control signals respectively associated with the two auxiliary circuits are respectively produced from the main control signals respectively associated with the main amplifiers of corresponding structures.

* * * * *

UNITED STATES PATENT AND TRADEMARK OFFICE
CERTIFICATE OF CORRECTION

| | |
|---|---|
| PATENT NO. | : 7,436,260 B2 |
| APPLICATION NO. | : 11/648104 |
| DATED | : October 14, 2008 |
| INVENTOR(S) | : Chamla et al. |

It is certified that error appears in the above-identified patent and that said Letters Patent is hereby corrected as shown below:

On the title page item [73], insert, --Centre National De La Recherche Scientifique (CNRS), (FR)--.

Signed and Sealed this
Nineteenth Day of January, 2016

Michelle K. Lee
*Director of the United States Patent and Trademark Office*